(12) United States Patent
Hongo

(10) Patent No.: US 9,065,404 B2
(45) Date of Patent: Jun. 23, 2015

(54) AMPLIFYING DEVICE

(75) Inventor: Naoki Hongo, Ome (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 118 days.

(21) Appl. No.: 13/979,461

(22) PCT Filed: Jan. 12, 2012

(86) PCT No.: PCT/JP2012/050459
§ 371 (c)(1),
(2), (4) Date: Jul. 12, 2013

(87) PCT Pub. No.: WO2012/096337
PCT Pub. Date: Jul. 19, 2012

(65) Prior Publication Data
US 2013/0285748 A1 Oct. 31, 2013

(30) Foreign Application Priority Data

Jan. 14, 2011 (JP) ................... 2011-006041

(51) Int. Cl.
| H03G 3/20 | (2006.01) |
| H03G 1/00 | (2006.01) |
| H03F 1/02 | (2006.01) |
| H03F 1/32 | (2006.01) |

(Continued)

(52) U.S. Cl.
CPC ............... *H03G 1/00* (2013.01); *H03F 1/0222* (2013.01); *H03F 1/3247* (2013.01); *H03F 3/189* (2013.01); *H03F 3/24* (2013.01);

(Continued)

(58) Field of Classification Search
CPC ..................................... H03F 3/24; H03G 3/20

USPC ................. 330/149; 375/296, 297; 455/114.3
See application file for complete search history.

(56) References Cited

U.S. PATENT DOCUMENTS

| 2004/0071225 A1 | 4/2004 | Suzuki et al. |
| 2013/0113557 A1 | 5/2013 | Hongo |

FOREIGN PATENT DOCUMENTS

| JP | 2001-102947 A | 4/2001 |
| JP | 2004-104194 A | 4/2004 |

(Continued)

OTHER PUBLICATIONS

International Search Report from International Application No. PCT/JP2012/050459 mailed Feb. 7, 2012.

*Primary Examiner* — Robert Pascal
*Assistant Examiner* — Khiem Nguyen
(74) *Attorney, Agent, or Firm* — Brundidge & Stanger, P.C.

(57) ABSTRACT

To effectively control the amplitude vs. power supply voltage characteristics, for example, in an ET amplifier. An amplifying device for amplifying an input signal wherein: amplifier means (4) amplifies the input signal; amplification control means (5, 7) control the power supply voltage to the amplification means on the basis of the input signal; first detection means (14) detects the amplification factor between the input signal and a feedback signal obtained by means of a feedback of the signal that has been amplified by the amplification means; second detection means (14) detects the variance of the amplification factors for each value or range of the amplitude of the input signal; and amplification control update means (14) performs an update so as to increase the power supply voltage with respect to a value or range of amplitude that exhibits a variance in excess of a predetermined threshold value, or to reduce the power supply voltage with respect to a value or range of amplitude that exhibits a variance lower than the predetermined threshold value.

6 Claims, 14 Drawing Sheets

(51) Int. Cl.
*H03F 3/189* (2006.01)
*H03F 3/24* (2006.01)

(52) U.S. Cl.
CPC .... *H03F 2200/336* (2013.01); *H03F 2200/504* (2013.01); *H03F 2200/102* (2013.01); *H03F 1/3294* (2013.01)

(56) References Cited

FOREIGN PATENT DOCUMENTS

| | | |
|---|---|---|
| JP | 2006-14241 A | 1/2006 |
| JP | 2010-4306 A | 1/2010 |
| JP | 2012-147385 A | 8/2012 |
| WO | 03103163 A1 | 12/2003 |

FIG.7
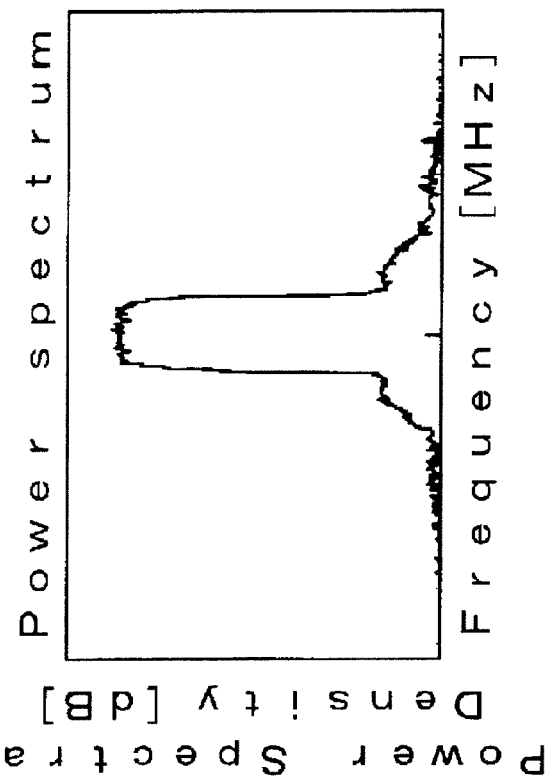
(b) FREQUENCY POWER SPECTRUM
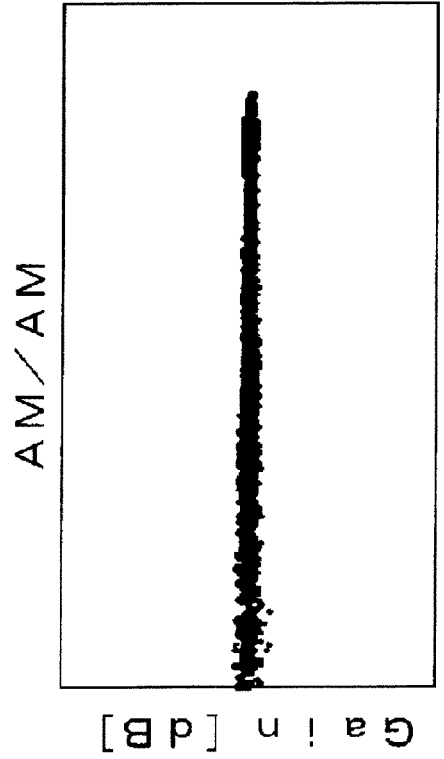
(a) AM/AM CHARACTERISTICS (a) AM/AM CHARACTERISTICS (b) FREQUENCY POWER SPECTRUM

AMPLIFYING DEVICE

TECHNICAL FIELD

The present invention relates to an amplifying device, and more particularly to an amplifying device, capable of adaptively controlling the amplitude versus power-supply voltage characteristics efficiently, in an ET amplifier with or without the distortion compensation function.

BACKGROUND ART

Low nonlinear distortion, high efficiency, and a wider bandwidth are required for a power amplifier.

Today, in general, high efficiency is realized by a Doherty amplifier and distortion is compensated for by a DPD (Digital Pre-Distorter).

For example, a signal with a high PAPR (Peak to Average Power Ratio), such as the WCDMA (Wideband Code Division Multiple Access) method or the OFDM (Orthogonal Frequency Division Multiplex) method, is used for third-generation or later mobile phones, in which case the system bandwidth is several dozen MHz.

A still wider bandwidth signal is used for the fourth generation. However, because a Doherty amplifier requires a back-off according to the PAPR, there is a limit to increasing the efficiency. In addition, load modulation with the use of a quarter-wave line makes it difficult to achieve a wider bandwidth.

To address this problem, study has been conducted for a system that allows the operation to be performed continually in a near-saturation condition by controlling the power-supply voltage of the amplifier according to the amplitude of the signal to be amplified. Such a method achieves high efficiency because it eliminates the need for a back-off in an ideal condition and, at the same time, achieves a wider bandwidth because it does not depend on the frequency of the signal to be amplified. Typical technologies of this method include ET (Envelope Tracking) and EER (Envelope Elimination and Restoration).

FIG. 10 is a diagram showing an example of the configuration of an ET amplifier (ET mode amplifier) in the analog mode.

The ET amplifier in this example includes a power amplifier unit (PA: Power Amplifier) 101, an amplitude detection unit 102, and a PA power supply unit 103.

An example of the operation performed by the ET amplifier in this example is described below.

The input signal is an RF signal generated by superimposing a modulated signal with a high PAPR, such as the CDMA signal or the OFDM signal, on the carrier wave with a radio frequency (RF: Radio Frequency).

The amplitude detection unit 102 receives the input signal and detects its amplitude. The PA power supply unit 103 controls the magnitude of the power supply voltage, supplied to the power amplifier unit 101, according to the magnitude of the detected amplitude. The power amplifier unit 101 receives the input signal, amplifies the power, and outputs the output signal (amplified signal). At this time, a delay circuit (not shown) is inserted as necessary on the receiving side or the power supply side of the power amplifier unit 101 to adjust the time so that the power amplifier unit 101 can supply power corresponding to the amplitude of the input signal.

As an example of the implementation of this amplifier, a diode detector is used for the amplitude detection unit 102, a class-D amplifier is used for the PA power supply unit 103, and a field effect transistor (FET: Field Effect Transistor) or a bipolar transistor is used for the power amplifier unit 101. Other known technologies are used to implement this amplifier.

FIG. 11 is a diagram showing an example of the comparison between the conventional method and the ET method.

In the graph shown in FIG. 11, the horizontal axis indicates the time (Time) and the vertical axis indicates a drain voltage (VDD), applied to the FET, as an example of an amplifier.

In the conventional method (Conventional), the fixed power supply voltage (Fixed VDD) is applied according to the maximum power while, in the ET method, the power supply voltage according to the amplitude of the input signal (Envelop indicated by the dotted line in FIG. 11) is applied to cause the amplifier to operate continually in the saturated condition.

Therefore, as compared with the conventional method, the ET method can reduce the supply voltage corresponding to the part indicated by the shaded part in FIG. 11. That is, the ET method can reduce the power supplied to the power amplifier unit 101, thus increasing efficiency.

The example of the ET method described above is a method for implementing the amplifier for analog signals. Next, the method for implementing the amplifier for digital signals is described.

FIG. 12 is a diagram showing an example of the configuration of an ET amplifier in the digital method.

The ET amplifier in this example includes a D/A (Digital to Analog) converter 111 corresponding to the I component of a complex signal, a D/A converter 112 corresponding to the Q component of a complex signal, an orthogonal modulation unit 113, a power amplifier unit (PA) 114, an amplitude detection unit 115, a D/A converter 116, and a PA power supply unit 117.

In the ET amplifier in the digital method in this example, the amplitude detection unit 115, PA power supply unit 117, and power amplifier unit 114 have the function similar to the processing units corresponding to the ET amplifier in the analog method shown in FIG. 10.

The ET amplifier in the digital method in this example is different from the ET amplifier in the analog method in that the ET amplifier includes three D/A converters 111, 112, and 116 and the orthogonal modulation unit 113.

An example of the operation performed by the ET amplifier in this example is described below.

The input signal is a digital signal composed of the I phase (I component), represented as I(t), and the Q phase (Q component) represented as Q(t). I(t) and Q(t) are each a function of time t.

The amplitude detection unit 115, provided in the digital unit, uses (Expression 1) to calculate the instantaneous amplitude Env(t) based on the input signals I(t) and Q(t). Env(t) is a function of time t.

[MATH. 1]

$$Env(t) = \sqrt{I^2(t) + Q^2(t)} \quad \text{(Expression 1)}$$

The output signal from the amplitude detection unit 115 (signal corresponding to instantaneous amplitude Env(t)) is converted from the digital signal to the analog signal via the D/A converter 116, and the converted signal is input to the PA power supply unit 117.

The PA power supply unit 117 performs the processing equivalent to that in the analog method shown in FIG. 10.

The input signals I(t) and Q(t) are converted from the digital signal to the analog signal via the two D/A converters 111 and 112. The converted signals are orthogonally modulated by the orthogonal modulation unit 113, and the power of the resulting orthogonally-modulated signal is amplified by the power amplifier unit 114.

Usually, a frequency converter (up converter), not shown, is used depending upon the radio frequency. For example, a frequency converter (up converter) is provided between the orthogonal modulation unit 113 and the power amplifier unit 114.

CITATION LIST

Patent Literature

Patent Literature 1: JP-A-2004-104194

SUMMARY OF INVENTION

Technical Problem

FIG. 13 is a diagram showing an example of the configuration of an ET amplifier with the distortion compensation function.

The ET amplifier with the distortion compensation function in this example includes a D/A converter 201 corresponding to the I component of a complex signal, a D/A converter 202 corresponding to the Q component of a complex signal, an orthogonal modulation unit 203, a power amplifier unit (PA) 204, a power supply control unit 205, a D/A converter 206, a PA power supply unit 207, a DPD unit 211, an A/D (Analog to Digital) converter 212, and a DPD control unit 213.

An example of the operation performed by the ET amplifier with the distortion compensation function in this example is described below.

The input signal is a digital signal composed of the I phase (I component), represented as I(t), and the Q phase (Q component) represented as Q(t). I(t) and Q(t) are each a function of time t.

The power supply control unit 205 uses (Expression 1) to detect the amplitude of the input signals I(t) and Q(t) (instantaneous amplitude Env(t)) and outputs a power supply control value for the power supply voltage to be supplied to the power amplifier unit 204 according to the detected amplitude.

In this case, the power supply control unit 205 may be implemented, for example; by providing a function that provides a table (for example, LUT: Look-Up Table) used to save the power supply voltage values (power supply control values), each corresponding an amplitude, in a memory and outputs a power supply control value based on the content of the table or by providing a function that has the value of a power supply voltage (power supply control value) as the function of amplitude, calculates a power supply control value for each sample, and outputs the calculated value. In this case, the power supply voltage is designed so that power efficiency is increased by the ET method.

FIG. 14 is a diagram showing an example of mapping between amplitudes and power supply control values.

In the graph shown in FIG. 14, the horizontal axis indicates the amplitude and the vertical axis indicates the power supply control value.

For example, the characteristics that increase the power supply voltage for large amplitude and decrease the power supply voltage for small amplitude implement the operation such as that of the ET amplifier shown in FIG. 10.

The configuration in this example is such that the power supply voltage is increased as the power supply control value is increased and the power supply voltage is decreased as the power supply voltage is decreased.

The power supply control value, output from the power supply control unit 205, is converted from the digital signal to the analog signal by the D/A converter 206 and is sent to the PA power supply unit 207.

The PA power supply unit 207 controls the magnitude of the power supply voltage to be supplied to the power amplifier unit 204 according to the received power supply control value.

The DPD unit 211 gives the inverse of the AM/AM characteristics and the AM/AM characteristics of the power amplifier unit 204 to the input signals I(t) and Q(t) to compensate for a nonlinear distortion of the power amplifier unit 204.

The DPD unit 211 may be implemented by various known technologies. Recently, the technology, which compensates for the memory effect, is also installed in the DPD unit 211.

The output signals I'(t) and Q'(t) from the DPD unit 211 are converted from the digital signal to the analog signal by the D/A converters 201 and 202, the converted signals are orthogonally converted by the orthogonal modulation unit 203, and the power of the resulting orthogonally converted signals are amplified by the power amplifier unit 204.

At this time, a delay circuit (not shown) is inserted as necessary on the receiving side or the power supply side of the power amplifier unit 204 to adjust the time so that the power amplifier unit 204 can supply power corresponding to the amplitude of the input signal.

Usually, a frequency converter (up converter), not shown, is used depending upon the radio frequency. For example, a frequency converter (up converter) is provided between the orthogonal modulation unit 203 and the power amplifier unit 204.

A part of the output signal (amplified signal) from the power amplifier unit 204 is acquired by a directional coupler and is fed back as the feedback signal Fb(t). This feedback signal is converted from the analog signal to the digital signal by the A/D converter 212 and is input to the DPD control unit 213. Fb(t) is the function of time t.

Usually, a frequency converter (down converter), not shown, is used depending upon the radio frequency. For example, a frequency converter (down converter) is provided between the power amplifier unit 204 and the A/D converter 212.

The DPD control unit 213 compares the received feedback signal and the input signal, stored in the memory, and adaptively controls the DPD unit 211 (for example, characteristics of its distortion compensation) to prevent the distortion compensation performance from being degraded due to temperature variations or aging.

The DPD control unit 213 may be implemented by various known technologies.

However, in designing the amplitude versus power-supply voltage characteristics of the power supply control unit 205 of the ET amplifier with the distortion compensation function described above, if the power supply voltage is set too low to increase power efficiency, the power amplifier unit 204 operates in a deeper saturation region. As a result, the limit of the distortion compensation ability is exceeded with the result that the quality standard related to a nonlinear distortion (for example, ACLR (Adjacent Channel Leakage power Ratio) or EVM(Error Vector Magnitude)) is not satisfied. On the other hand, if the power supply voltage is set high enough to satisfy the quality standard, power efficiency is decreased and the problem of a wasteful power consumption is generated.

To solve this problem, the development of a technology that increases (for example, maximizes) power efficiency while satisfying the quality standard is long awaited.

Another problem is described below using an example of a mobile phone system.

For a base station, the strict standards are defined for the out-of-band emission power to prevent interference with other systems and for ensuring communication quality without increasing the circuit size of a mobile station are strict. For a mobile station, the standard is relatively relaxed to prolong the lifetime of a battery. That is, reduction in nonlinear distortion is important for a base station while power efficiency is important for a mobile station.

The study of the above problems leads to the need for a method for adaptively determining the amplitude versus power-supply voltage characteristics according to the quality standard related to nonlinear distortions. Such a method, if available, would increase development efficiency because there is no need for designing the amplitude versus power-supply voltage characteristics each time they are determined and, at the same time, solve the problems of a difference among individual amplification elements and the problem of time required for the adjustment of individual amplification elements.

Conventionally, there has been an increasing need for the development of a method for adaptively determining the amplitude versus power-supply voltage characteristics.

In view of the foregoing, it is an object of the present invention to provide an amplifying device capable of adaptively controlling the amplitude versus power-supply voltage characteristics efficiently in an ET amplifier with or without the distortion compensation function.

Solution to Problem

To achieve the objects described above, the present invention provides the following configuration.

Configuration Example 1

An example of the configuration according to the generic concept is described below.

The present invention provides the following configuration of an amplifying device that amplifies an input signal.

That is, amplification means amplifies the input signal. Amplification control means controls a power supply voltage, which is supplied to the amplification means, based on the input signal. First detection means detects an amplification factor (or a phase difference) between the input signal and a feedback signal generated by feeding back the signal amplified by the amplification means. Second detection means detects a variance of amplification factors (or phase differences) of each value or range of amplitude of the input signal for the amplification factors (or phase differences) detected by the first detection means. Amplification control update means updates the power supply voltage, which is controlled by the amplification control means and is supplied to the amplification means, to a higher voltage for a value or range of amplitude where the variance detected by the second detection means is larger than a predetermined threshold, and updates the power supply voltage, which is controlled by the amplification control means and is supplied to the amplification means, to a lower voltage for a value or range of amplitude where the variance detected by the second detection means is smaller than the predetermined threshold.

Therefore, this configuration allows an ET amplifier with or without the distortion compensation function to adaptively control the amplitude versus power-supply voltage characteristics efficiently.

Various devices may be used as the amplification means. For example, a power amplifier may be used.

As the mode for controlling the power supply voltage based on the input signal, the mode for controlling the power supply voltage based on the amplitude of the input signal or the level of power may be used.

As the value or range of amplitude, a value of amplitude may be used or a range of amplitude may be used. When a range of amplitude is used, various modes may be used as the range or the count included in the range (total) respectively.

Various values may be used as the predetermined threshold of a variance.

As the amount or the time of update of power supply voltage, various modes may be used. For example, an amount, such as a fixed amount or a varying amount, or a time, such as a fixed time or a varying time, may be used.

As the mode for updating the power supply voltage that is controlled by the amplification control means and is supplied to the amplification means, various modes may be used. For example, when a table is used to control the power supply voltage, the mode for changing (updating) the information content of the table may be used or, when a mathematical expression or a parameter is used to control the power supply voltage, the mode for changing (updating) the mathematical expression or the parameter may be used.

As the amplification factor between the input signal and the feedback signal, the value calculated as (amplitude of feedback signal)/(amplitude of input signal) or (amplitude of input signal)/(amplitude of feedback signal) may be used.

As the phase difference between the input signal and the feedback signal, the absolute value of {(phase of input signal)−(phase of feedback signal)} may be used.

Configuration Example 2

An example of the configuration in which an amplification factor is used is described below.

The present invention provides the following configuration of an amplifying device that amplifies an input signal.

That is, amplification means amplifies the input signal. Amplification control means controls a power supply voltage, which is supplied to the amplification means, based on the input signal. Input amplitude detection means detects an amplitude of the input signal. Feedback detection means detects a feedback signal generated by feeding back the signal amplified by the amplification means. Feedback amplitude detection means detects an amplitude of the signal detected by the feedback detection means. Amplification factor detection means detects a amplification factor based on the amplitude, detected by the input amplitude detection means, and the amplitude detected by the feedback amplitude detection means. Amplitude-amplification factor mapping means maps the amplification factor to the value or range of amplitude wherein the amplification factor is detected by the amplification factor detection means and the value or range of amplitude is detected by the input amplitude detection means. Variance detection means detects a variance of amplification factors of each value or range of amplitude of the input signal based on the mapping created by the amplitude-amplification factor mapping means. Amplification control update means updates the power supply voltage, which is controlled by the amplification control means and is supplied to the amplification means, to a higher voltage for a value or range of amplitude where the variance detected by the variance detection means is larger than a predetermined threshold, and updates the power supply voltage, which is controlled by the amplification control means and is supplied to the amplification means, to a lower voltage for a value or range of amplitude where the variance detected by the variance detection means is smaller than the predetermined threshold.

Therefore, this configuration allows an ET amplifier with or without the distortion compensation function to adaptively control the amplitude versus power-supply voltage characteristics efficiently.

The description given above for a component (configuration example 1) applies to the corresponding component in this configuration.

As the mode for mapping the amplification factor to a value or range of amplitude and as the mode for detecting a variance of amplification factors for each value or range of amplitude, various modes may be used. For example, the modes that may be used include the following: the mode for mapping the amplification factor to the value of amplification and, for each value of amplitude, detecting a variance of amplification factors for samples having the same value of amplitude, the mode for mapping the amplification factor to the value of amplification and, for each range of amplitude, detecting a variance of amplification factors for samples belonging to the same range of amplitude, and the mode for mapping the amplification factor to a range of amplitude and, for each range of amplitude, detecting a variance of amplification factors for samples belonging to the same value of amplitude.

Configuration Example 3

An example of the configuration in which a phase difference is used is described below.

The present invention provides the following configuration of an amplifying device that amplifies an input signal.

That is, amplification means amplifies the input signal. Amplification control means controls a power supply voltage, which is supplied to the amplification means, based on the input signal. Input amplitude detection means detects an amplitude of the input signal. Input phase detection means detects a phase of the input signal. Feedback orthogonal detection means orthogonally detects a feedback signal generated by feeding back the signal amplified by the amplification means. Feedback phase detection means detects a phase of the signal detected by the feedback orthogonal detection means. Phase difference detection means detects a phase difference based on the phase, detected by the input phase detection means, and the phase detected by the feedback phase detection means. Amplitude-phase difference mapping means maps the phase difference to a value or range of amplitude wherein the phase difference is detected by the phase difference detection means and the value or the range of amplitude is detected by the input amplitude detection means. Variance detection means detects a variance of phase differences of each value or range of amplitude of the input signal based on the mapping created by the amplitude-phase difference mapping means. Amplification control update means updates the power supply voltage, which is controlled by the amplification control means and is supplied to the amplification means, to a higher voltage for a value or range of amplitude where the variance detected by the variance detection means is larger than a predetermined threshold, and updates the power supply voltage, which is controlled by the amplification control means and is supplied to the amplification means, to a lower voltage for a value or range of amplitude where the variance detected by the variance detection means is smaller than the predetermined threshold.

Therefore, this configuration allows an ET amplifier with or without the distortion compensation function to adaptively control the amplitude versus power-supply voltage characteristics efficiently.

The description given above for a component above (configuration example 1) applies to the corresponding component.

As the mode for mapping the phase difference to a value or range of amplitude and as the mode for detecting a variance of phase differences for each value or range of amplitude, various modes may be used. For example, the modes that may be used include the following: the mode for mapping the phase difference to the value of amplification and, for each value of amplitude, detecting a variance of phase differences for samples having the same value of amplitude, the mode for mapping the phase difference to the value of amplification and, for each range of amplitude, detecting a variance of phase differences for samples belonging to the same range of amplitude, and the mode for mapping the phase difference to a range of amplitude and, for each range of amplitude, detecting a variance of phase differences for samples belonging to the same value of amplitude.

Configuration Example 4

A further example of the configuration in (configuration example 1) to (configuration example 3) given above is described below.

The present invention provides the following configuration of an amplifying device according to one of (configuration example 1) to (configuration example 3) given above.

That is, pre-distortion means performs distortion compensation for the signal, amplified by the amplification means, using a pre-distortion method.

Therefore, this configuration allows an ET amplifier with the distortion compensation function to adaptively control the amplitude versus power-supply voltage characteristics efficiently. For example, when the control of the power supply voltage and the distortion compensation by means of the pre-distortion method are used at the same time, effective control is achieved by this combination.

In this case, various pre-distorters may be used as the pre-distorter means. For example, a pre-distorter (memory-less pre-distorter) that performs distortion compensation for the AM/AM characteristics and the AM/PM characteristics may be used or, along with the memory-less distorter, a pre-distorter (memory pre-distorter) that performs distortion compensation for the memory effect may be used.

Advantageous Effects of Invention

As described above, an amplifying device according to the present invention can adaptively control the amplitude versus power-supply voltage characteristics efficiently in an ET amplifier with or without the distortion compensation function.

BRIEF DESCRIPTION OF DRAWINGS

FIGS. 7(a) and 7(b) are diagrams showing an example of the distortion compensation characteristics of a power amplifier unit (PA), where the power supply voltage is constant, when a DPD is used.

DESCRIPTION OF EMBODIMENT

Embodiments of the present invention are described below with reference to the drawings.

First, the following describes the outline.

In this embodiment, the output signal from the power amplifier (PA) is fed back, the variance of gains of each amplitude is calculated, and the power supply voltage of the ET amplifier is adjusted according to the variance of gains.

Figure 6:
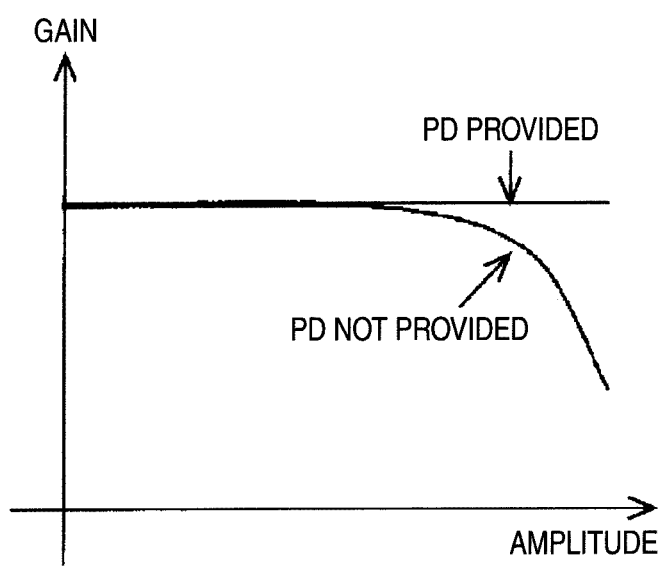
FIG. 6 is a diagram showing an example of AM/AM characteristics.

FIG. 6 shows an example of AM/AM characteristics.

In the graphs shown in FIG. 6, the horizontal axis indicates the amplitude and the vertical axis indicates the gain. The figure shows an example of characteristics when a pre-distorter (PD) is provided and an example of characteristics when a pre-distorter (PD) is not provided.

When the amplitude of the input signal is increased in a general amplification device, the saturation region is reached and the gain is reduced sharply. This is the cause of nonlinear distortions. To address this problem, a PD (for example, DPD) is used to compensate for nonlinear characteristics to produce a constant gain.

However, in an actual power amplification unit (PA), there is a nonlinear distortion caused by a memory effect.

FIGS. 7(a) and 7(b) show an example of distortion compensation characteristics of a power amplification unit (PA), whose power supply voltage is constant, when a DPD is used.

Figure 8:
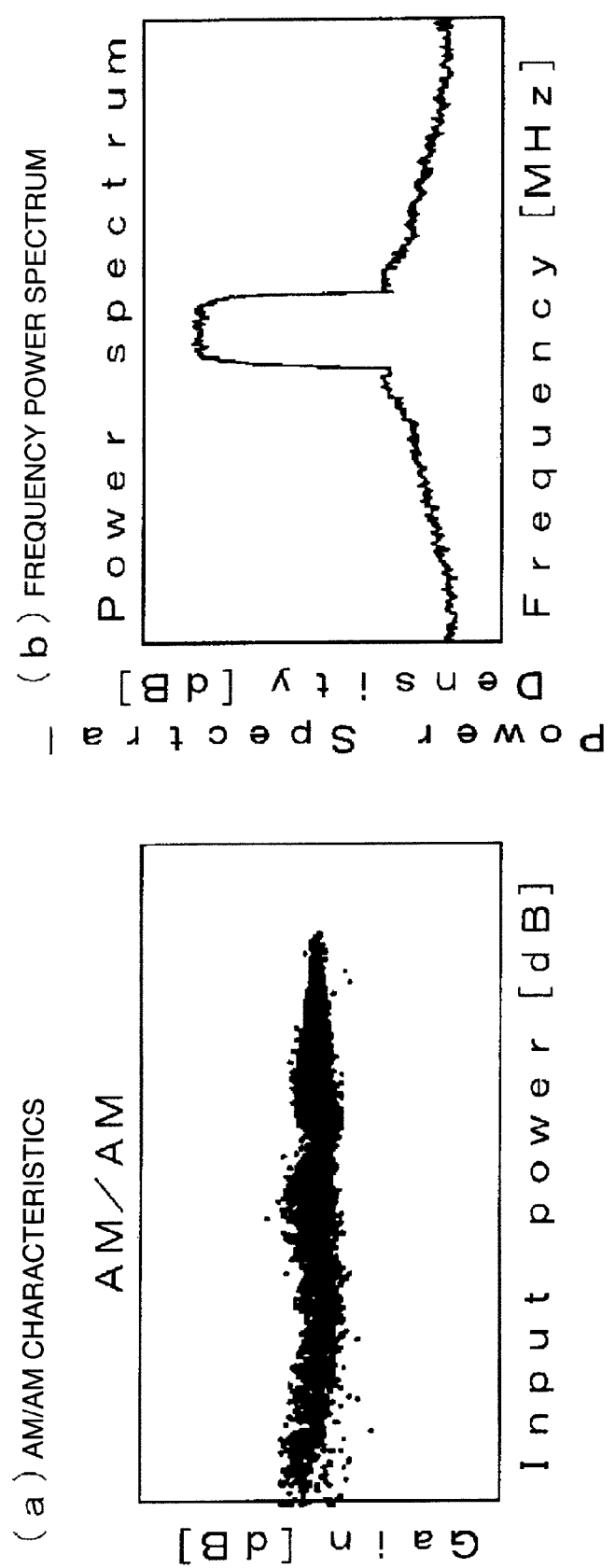
FIGS. 8(a) and 8(b) are diagrams showing a first example of the distortion compensation characteristics of a power amplifier unit (PA) in the ET method when a DPD is used.

FIGS. 8(a) and 8(b) show a first example of distortion compensation characteristics of a power amplification unit (PA) in the ET method when a DPD is used.

Figure 9:
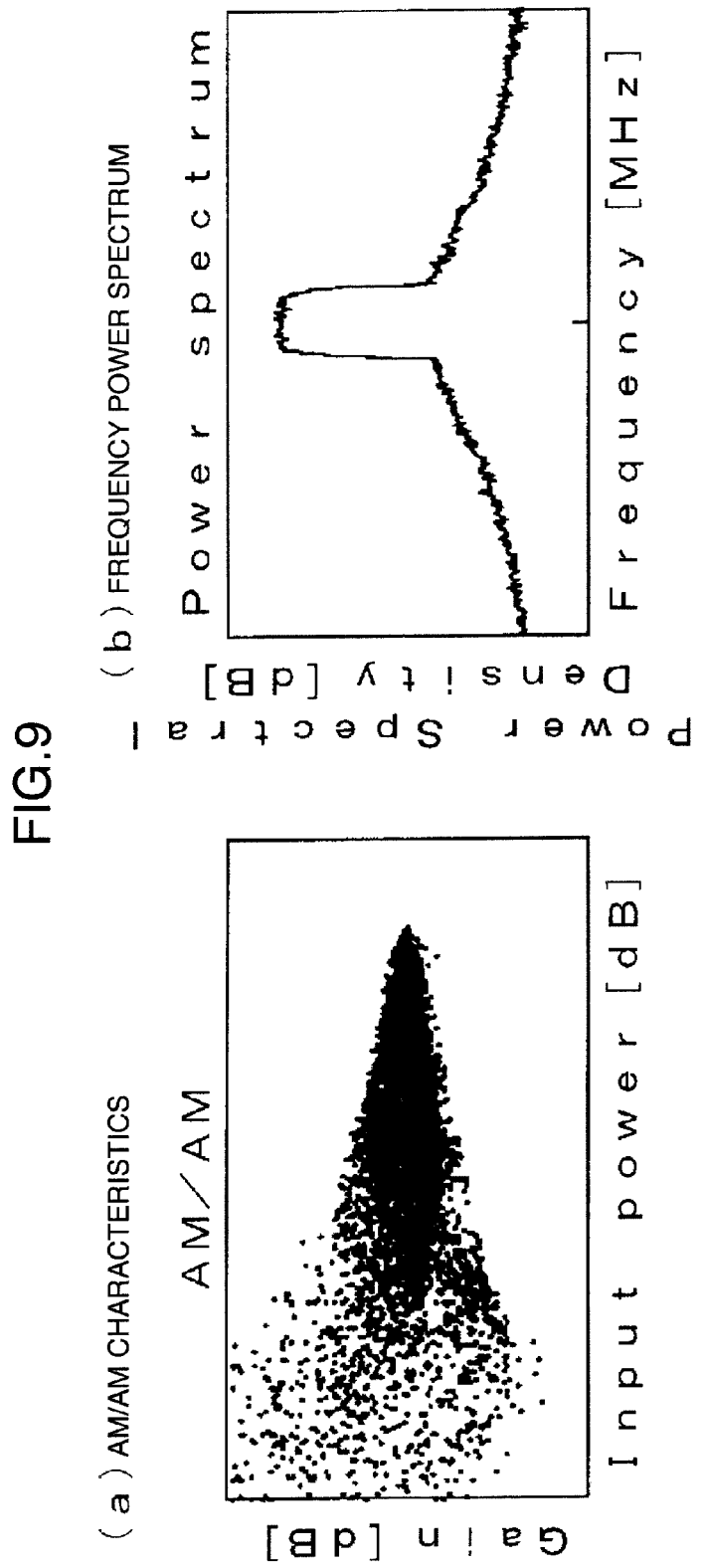
FIGS. 9(a) and 9(b) are diagrams showing a second example of the distortion compensation characteristics of a power amplifier unit (PA) in the ET method when a DPD is used.
Figure 10:
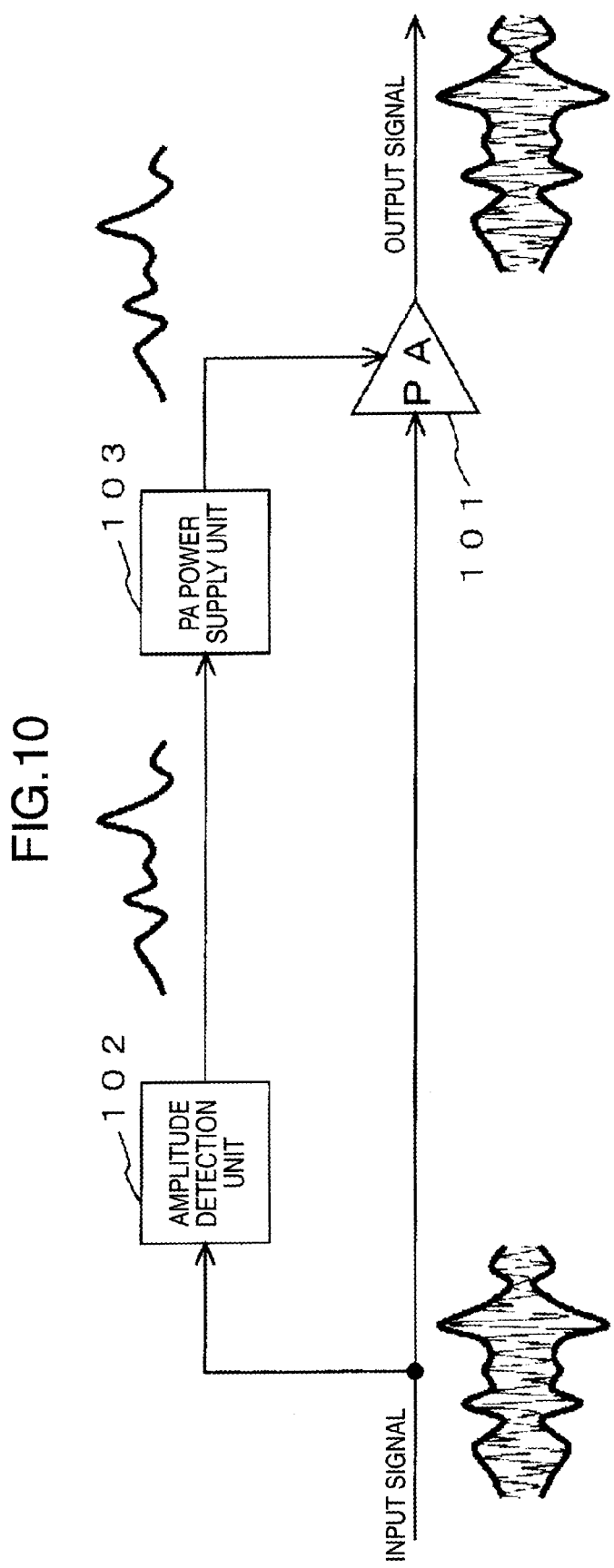
FIG. 10 is a diagram showing an example of the configuration of an ET amplifier in the analog mode.
Figure 11:
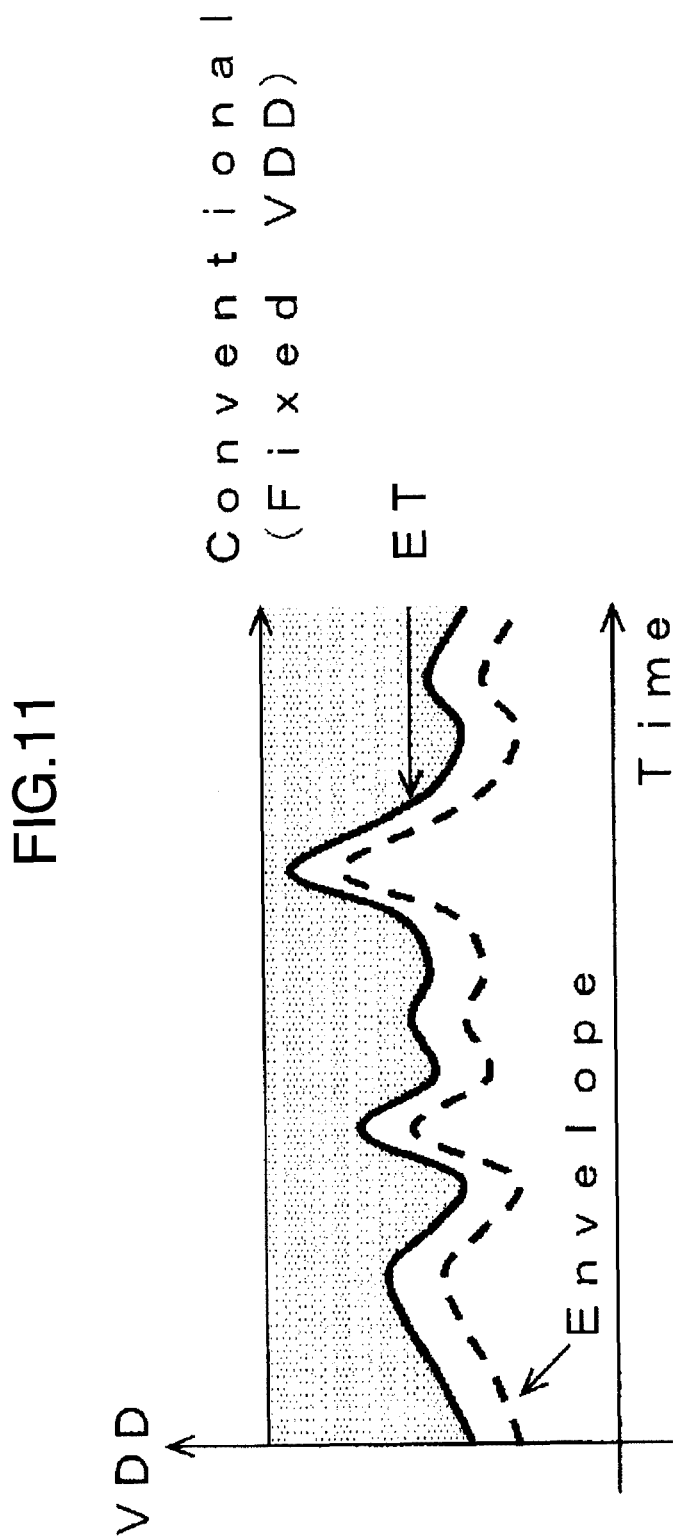
FIG. 11 is a diagram showing an example of comparison between the conventional method and the ET method.

FIGS. 9(a) and 9(b) show a second example of distortion compensation characteristics of a power amplification unit (PA) in the ET method when a DPD is used.

In the second example shown in FIGS. 9(a) and 9(b), the power supply voltage is lower than that in the first example shown in FIGS. 8(a) and 8(b).

FIG. 7(a), FIG. 8(a) and FIG. 9(a) show an example of AM/AM characteristics. The horizontal axis of the graph indicates the input power (Input Power) [dB], and the vertical axis of the graph indicates the gain (Gain) [dB].

FIG. 7(b), FIG. 8(b) and FIG. 9(b) show an example of frequency power spectrum (Power Spectrum). The horizontal axis of the graph indicates the frequency (Frequency) [MHz], and the vertical axis of the graph indicates the power spectral density (Power Spectral Density) [dB].

The AM/AM characteristics shown in FIG. 7(a), FIG. 8(a) and FIG. 9(a) indicate that the gain varies due to the memory effect even when the input amplitudes are equal. The amplitude average, which is made constant by means of a DPD, indicates that the DPD functions normally and that the distortion compensation function of the DPD has reached its limit. The memory effect is generated frequently in the saturation region and, if the memory effect is too large, the DPD, which is provided for reducing the memory effect, cannot compensate for the distortion completely.

When the power supply voltage of the power amplification unit (PA) is constant as in the example shown in FIGS. 7(a) and 7(b), the saturation region is reached only when the input power is in the large signal region. Therefore, the variation in gains, that is, the variance of gains, is small in a region where the input power is small. On the other hand, the power supply voltage is set low when the amplitude is small in the ET method as shown in the example in FIGS. 8(a) and 8(b) or in the example in FIGS. 9(a) and 9(b) and, therefore, the operation is performed in the near-saturation region even when the input signal is in the small signal region with the result that the variance of gains is increased.

The power supply is set lower in the example in FIG. 9(a) and FIG. 9(b) than in the example in FIG. 8(a) and FIG. 8(b). The comparison between these two examples indicates that the efficiency is increased but the variance of gains becomes larger.

Therefore, there is a relation between the variance of gains and the power efficiency.

In addition, as shown in FIG. 7(b), FIG. 8(b), and FIG. 9(b), the energy of unwanted waves, generated due to a nonlinear distortion, is increased when the variance of gains is increased.

Therefore, there is a relation between the variance of gains and the radio characteristics (ACLR, EVM, etc.).

As described above, there is a tradeoff between power efficiency and radio characteristics, and both have a correlation with an increase/decrease in the variance of gains.

Considering this relation, this embodiment minimizes the power supply voltage while setting the variance of gains equal to or lower than the value determined by the required quality, thus optimizing the ET amplifier.

First Embodiment

A first embodiment of the present invention is described.

Figure 1:
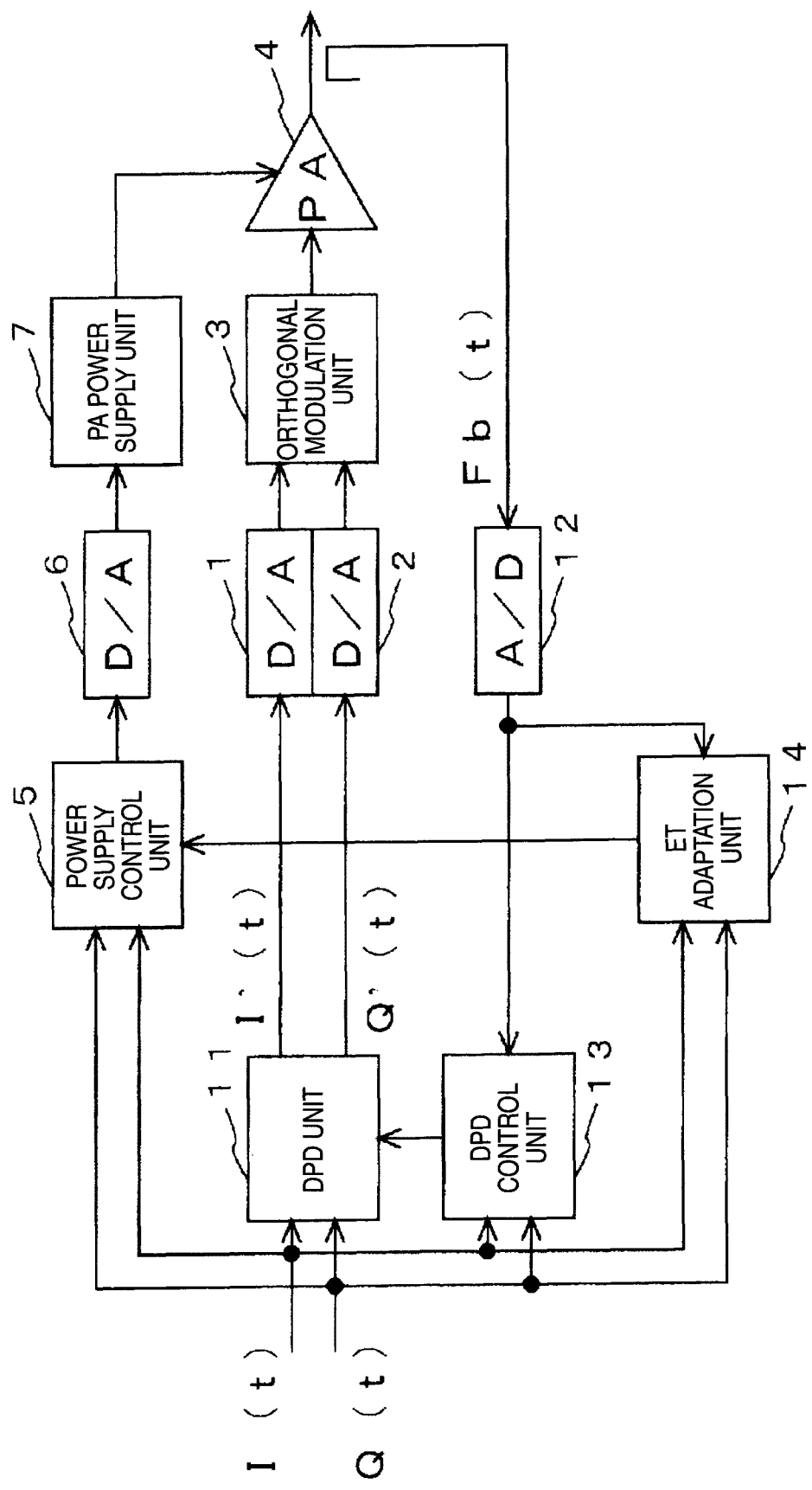
FIG. 1 is a diagram showing an example of the configuration of an ET amplifier with the distortion compensation function in one embodiment (first embodiment) of the present invention.

FIG. 1 is a diagram showing an example of the configuration of an ET amplifier with the distortion compensation function in one embodiment of the present invention.

The ET amplifier with the distortion compensation function in this example includes a D/A converter 1 corresponding to the I component of a complex signal, a D/A converter 2 corresponding to the Q component of a complex signal, an orthogonal modulation unit 3, a power amplifier unit (PA) 4 composed of a power amplifier, a power supply control unit 5, a D/A converter 6, a PA power supply unit 7, a DPD unit 11, an A/D converter 12, a DPD control unit 13, and an ET adaptation unit 14.

Figure 13:
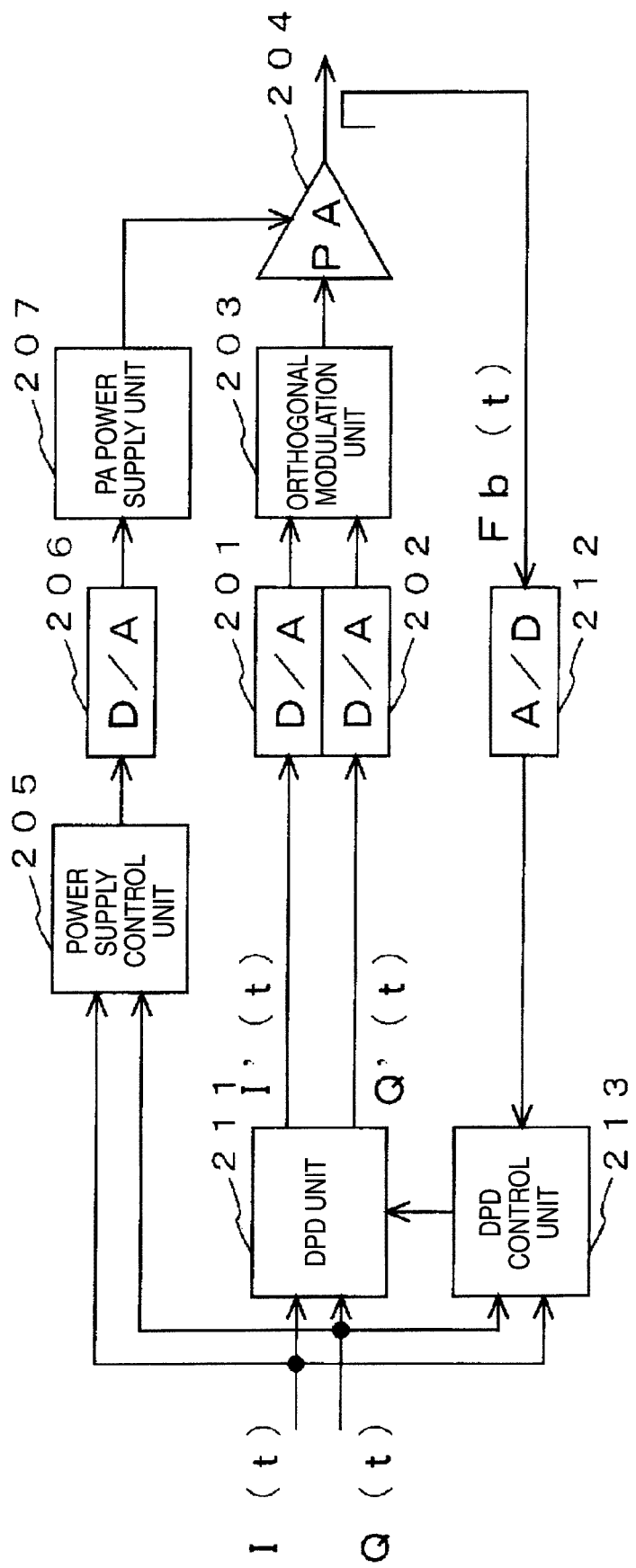
FIG. 13 is a diagram showing an example of the configuration of an ET amplifier with the distortion compensation function.

The configuration of the ET amplifier with the distortion compensation function in this example is generally similar to the configuration of the ET amplifier with the distortion compensation function shown in FIG. 13 except that the ET adaptation unit 14 is added.

An example of the operation performed by the ET amplifier with the distortion compensation function in this example is described below.

The input signal is a digital signal composed of the I phase (I component), represented as I(t), and the Q phase (Q component) represented as Q(t). I(t) and Q(t) are each a function of time t.

The power supply control unit 5 uses (Expression 1) to detect the amplitude of the input signals I(t) and Q(t) (instantaneous amplitude Env(t)) and outputs a power supply control value for the power supply voltage to be supplied to the power amplifier unit 4 according to the detected amplitude.

In this case, the power supply control unit 5 may be implemented, for example, by providing a function that provides a table (for example, LUT: Look-Up Table) used to save the power supply voltage values (power supply control values), each corresponding an amplitude, in a memory and outputs a power supply control value based on the content of the table or by providing a function that has the value of a power supply voltage (power supply control value) as the function of amplitude, calculates a power supply control value for each sample, and outputs the calculated value.

In this example, the configuration is that the power supply voltage is increased as the power supply control value is increased and that the power supply voltage is decreased as the power supply control value is decreased.

The power supply control value, output from the power supply control unit 5, is converted from the digital signal to the analog signal by the D/A converter 6 and is sent to the PA power supply unit 7.

The PA power supply unit 7 controls the magnitude of the power supply voltage to be supplied to the power amplifier unit 4 according to the received power supply control value.

The DPD unit 11 gives the inverse of the AM/AM characteristics and the AM/PM characteristics of the power amplifier unit 4 to the input signals I(t) and Q(t) to compensate for a nonlinear distortion of the power amplifier unit 4.

The DPD unit 11 may be implemented by various known technologies. Recently, the technology, which compensates for the memory effect, is also installed in the DPD unit 11 As the DPD unit 11, a pre-distorter (memory-less pre-distorter), which performs distortion compensation for the AM/AM characteristics and the AM/PM characteristics, may be used or a pre-distorter (memory pre-distorter), which performs distortion compensation for the memory effect, may be used with the memory-less pre-distorter.

The output signals I'(t) and Q'(t) from the DPD unit 11 are converted from the digital signal to the analog signal by the D/A converters 1 and 2, the converted signals are orthogonally converted by the orthogonal modulation unit 3, and the power of the resulting orthogonally converted signals are amplified by the power amplifier unit 4.

At this time, a delay circuit (not shown) is inserted as necessary on the receiving side or the power supply side of the power amplifier unit 4 to adjust the time so that the power amplifier unit 4 can supply power corresponding to the amplitude of the input signal.

Usually, a frequency converter (up converter), not shown, is used depending upon the radio frequency. For example, a frequency converter (up converter) is provided between the orthogonal modulation unit 3 and the power amplifier unit 4.

A part of the output signal (amplified signal) from the power amplifier unit 4 is acquired by a directional coupler and is fed back as the feedback signal Fb(t). This feedback signal is converted from the analog signal to the digital signal by the A/D converter 12 and is input to the DPD control unit 13 and the ET adaptation unit 14. Fb(t) is the function of time t.

Usually, a frequency converter (down converter), not shown, is used depending upon the radio frequency. For example, a frequency converter (down converter) is provided between the power amplifier unit 4 and the A/D converter 12.

The DPD control unit 13 compares the received feedback signal and the input signal, stored in the memory, and adaptively controls the DPD unit 11 (for example, characteristics of its distortion compensation) to prevent the distortion compensation performance from being degraded due to temperature variations or aging.

The DPD control unit 13 may be implemented by various known technologies.

The ET adaptation unit 14 receives the input signals I(t) and Q(t) and the signal Fb(t) that is the feedback signal of the output signal from the power amplifier unit 4.

The ET adaptation unit 14 finds the variance of the amplification factor (gain) of the power amplifier unit 4 for each amplitude of the input signal. For an amplitude whose variance is larger than the threshold (variance threshold) determined according to the required quality, the power supply voltage is set higher than the current voltage. For an amplitude whose variance is smaller than the threshold (variance threshold), the power supply voltage is set lower than the current voltage. According to this rule, the ET adaptation unit 14 adaptively controls the mapping between amplitudes and power supply control values provided in the power supply control unit 5 (mapping such as that shown in FIG. 14 or mapping prepared by other method).

Any of various values may be used as the variance threshold. One of them is the empirical variance value, obtained from the result of measurements performed multiple times in advance as the parameter—the radio characteristics (for example, ACLR). In the adaptive control, any of various values may be used as the amount of the power supply voltage to be increased or decreased. For example, some specific small value may be used or various methods may be used to find the value; in one method, the value may be changed according to the difference, or according to the ratio, between the variance threshold and the variance and, in another method, the value is decreased as the time elapses. Any of these methods may be used according to the system requirements.

As described above, the ET amplifier with the distortion compensation function in this example calculates the amplification factor (gain) between the input signal and the feedback signal and calculates the variance of the amplification factors for each amplitude of the input signal. For an amplitude whose variance is larger than the variance threshold determined according to the required quality, the power supply voltage of the power amplifier unit 4 is set higher than the current voltage. For an amplitude whose variance is smaller than the variance threshold, the power supply voltage of the power amplifier unit 4 is set lower than the current voltage.

Therefore, for the power amplifier unit 4, the ET amplifier with the distortion compensation function in this example can increase (for example, maximizes) power efficiency while satisfying the quality standard related to a nonlinear distortion, thus implementing the high quality and high efficiency of the power amplifier (power amplifier unit 4).

The ET amplifier with the distortion compensation function in this example increases development efficiency and solves the problems of a difference among individual amplification elements and the problem of time required for the adjustment of individual amplification elements.

The ET amplifier with the distortion compensation function in this example can adjust the amplitude of the output signal by both of the adjustment of the power supply voltage from the PA power supply unit 7 to the power amplifier unit 4 and the adjustment performed by the DPD unit (amplitude adjustment unit in the DPD unit). This configuration improves (preferably maximizes) the mode of combination of these two adjustments.

In the ET amplifier with the distortion compensation function (one example of amplifying device) in this example, the amplification means is configured by the function of the power amplifier unit 4, the amplification control means is configured by the function of the power supply control unit 5 and the PA power supply unit 7, the first detection means for detecting the amplification factor (or phase difference in another configuration example), the second detection means for detecting the variance of amplification factors (or variance of phase differences in another configuration example), and the amplification control update means for updating the control mode of power supply voltage for the power amplifier unit 4 are configured by the function of the ET adaptation unit 14. In addition, the pre-distortion means is configured in this example by the function of the DPD unit 11 or DPD control unit 13.

Second Embodiment

A second embodiment of the present invention is described.

Figure 2:
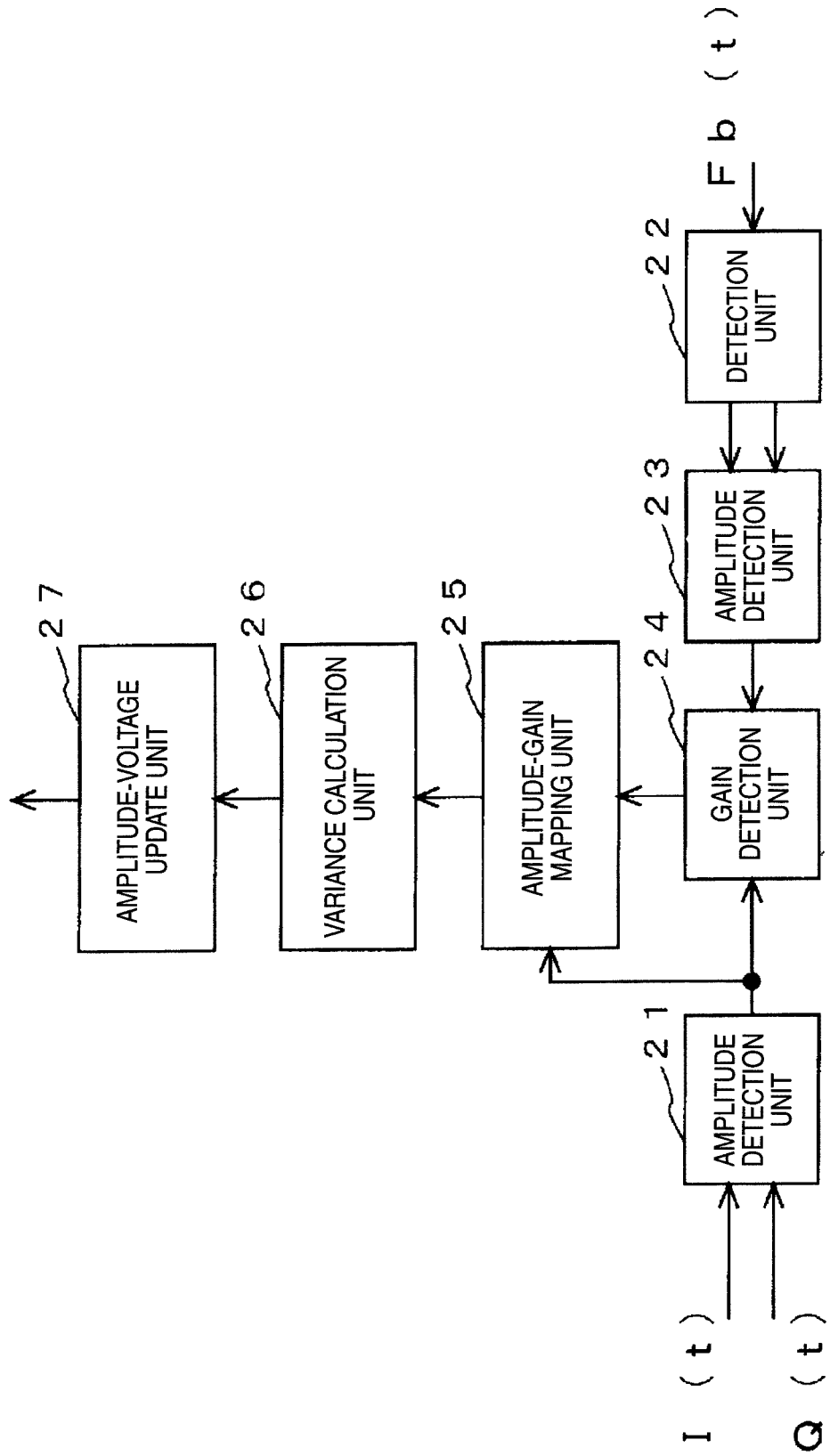
FIG. 2 is a diagram showing an example of the configuration of an ET adaptation unit.

FIG. 2 is a diagram showing an example of the configuration of an ET adaptation unit 14, shown in FIG. 1, as one preferable embodiment.

The ET adaptation unit 14 in this example includes an amplitude detection unit 21, a detection unit 22, an amplitude detection unit 23, a gain detection unit 24, an amplitude-gain mapping unit 25, a variance calculation unit 26, and an amplitude-voltage update unit 27.

An example of the operation performed by the ET adaptation unit 14 in this example is described below.

The signals I(t) and Q(t) input to the amplitude detection unit 21 are each a digital signal composed of the I phase and the Q phase.

Figure 12:
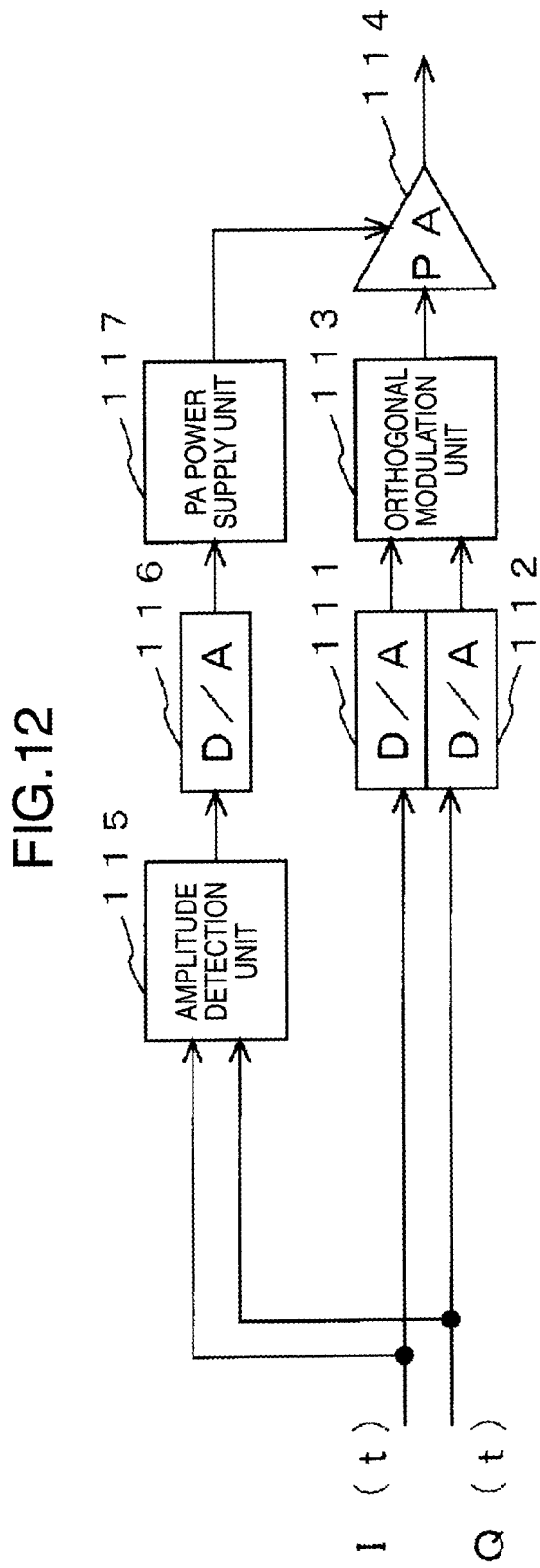
FIG. 12 is a diagram showing an example of the configuration of an ET amplifier in the digital mode.

As with the amplitude detection unit 115 shown in FIG. 12, the amplitude detection unit 21 uses (Expression 1) to calculate the instantaneous amplitude Env(t) based on the input signals I(t) and Q(t). Env(t) is the function of time t. In this example, the amplitude detection unit 21 outputs the calculated instantaneous amplitude Env(t) to the gain detection unit 24 and the amplitude-gain mapping unit 25.

The signal input to the detection unit 22 is a digitally converted feedback signal Fb(t) that is output from the power amplifier unit 4.

The detection unit 22 detects the received feedback signal and outputs the detected result (I component and Q component) to the amplitude detection unit 23. In this example, orthogonal detection is used as an example of detection in the preferable mode.

The amplitude detection unit 23, which has the function similar to that of the amplitude detection unit 21, uses (Expression 1) to calculate the instantaneous amplitude Env(t)' for the received signal (feedback signal) of the detection result and outputs the calculated value to the gain detection unit 24.

In this case, when analog detection is performed, the detection unit 22 is provided in the preceding stage of the A/D converter 12 shown in FIG. 1. When envelope detection is performed as the detection method, the amplitude detection unit 23 may be omitted. That is, for the feedback system, it is only required in this example that the envelope information about the feedback signal be input to the gain detection unit 24.

The gain detection unit 24 synchronizes the input signal with the feedback signal and, based on the instantaneous amplitude of the input signal and the instantaneous amplitude of the feedback signal stored in the memory, calculates the amplification factor (gain) between the input signal and the feedback signal for a plurality of samples within an arbitrary limited duration and then outputs the calculated result to the amplitude-gain mapping unit 25.

The amplitude-gain mapping unit 25 maps the amplitude of the input signal, detected by the amplitude detection unit 21, to the gain, detected by the gain detection unit 24, and stores the mapping in the memory.

Using the data stored by the amplitude-gain mapping unit 25, the variance calculation unit 26 calculates the variance of the gains, included in the same amplitude range, for each amplitude range and outputs the calculated variance to the amplitude-voltage update unit 27. The range of amplitude may be any value.

The amplitude-voltage update unit 27 compares each gain variance and the threshold of the gain variance (variance threshold) and, according to the comparison result, updates the mapping between amplitudes and power supply control values stored in the power supply control unit 5. More specifically, the amplitude-voltage update unit 27 updates the power supply control value in such a way that the power supply voltage is increased for a range of amplitudes where the gain variance is larger than the variance threshold and that the power supply voltage is decreased for a range of amplitudes where the gain variance is smaller than the variance threshold.

The operation of this example is described with reference to FIGS. 3(*a*) and 3(*b*).

Figure 3:
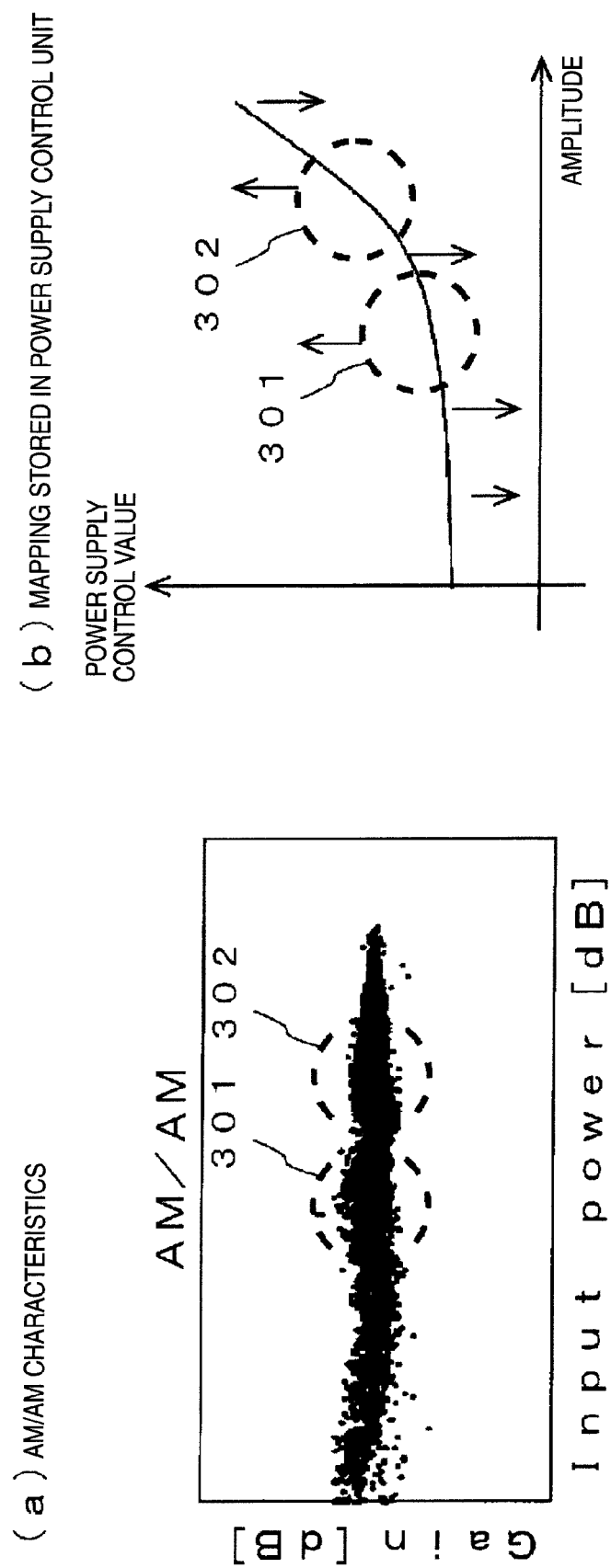
FIG. 3(a) is a diagram showing an example of AM/AM characteristics and FIG. 3(b) is a diagram showing an example of mapping stored in a power supply control unit.

FIG. 3(*a*) shows an example of the AM/AM characteristics. The horizontal axis of the graph indicates the input power (Input Power) [dB], and the vertical axis of the graph indicates the gain (Gain) [dB].

FIG. 3(*b*) shows an example of the mapping stored in the power supply control unit 5. The horizontal axis of the graph indicates the amplitude, and the vertical axis of the graph indicates the power supply control value.

In the part surrounded by the dotted line (areas 301 and 302) in the AM/AM characteristics shown in FIG. 3(*a*), the gain variance is larger than the variance threshold. Therefore, for the corresponding amplitude ranges (areas 301 and 302) in the mapping stored in the power control unit shown in FIG. 3(*b*), the voltage (power supply control value) is increased and, for the other amplitudes, the voltage (power supply control value) is decreased because the gain variance is smaller than the variance threshold.

As a preferable mode, the result of an example is shown in this example in which the voltage is updated for the center of an amplitude range and the update result is interpolated for other amplitudes. It is considered that good characteristics are obtained using various average methods, such as the least squares method, or various interpolation methods, and any of those methods may be selected and used.

Figure 4:
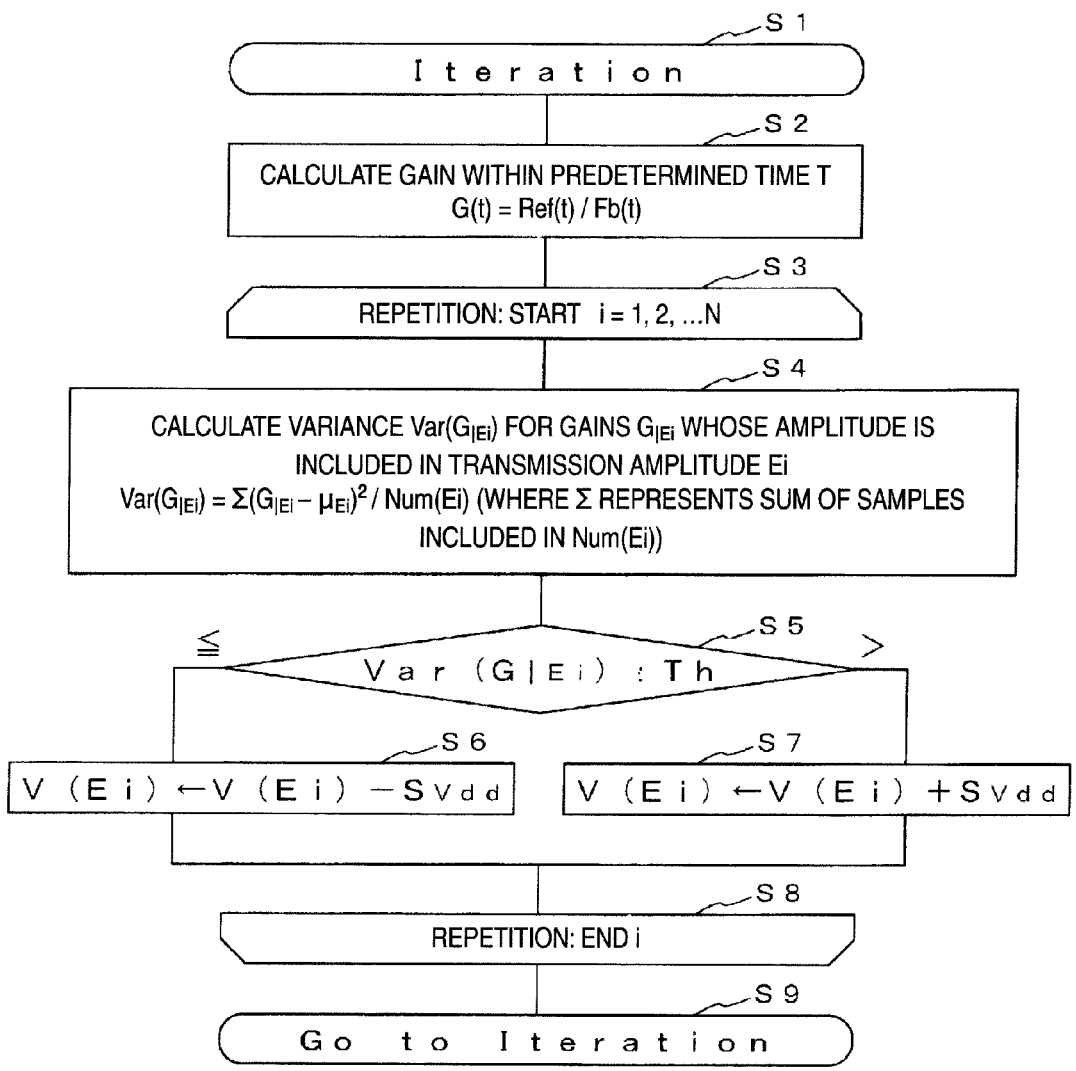
FIG. 4 is a flowchart showing an example of a processing procedure for controlling the power supply control unit by an ET adaptation unit in the ET amplifier with the distortion compensation function.

FIG. 4 shows an example of the procedure for the processing in which the ET adaptation unit 14 controls the power supply control unit 5 in the ET amplifier with the distortion compensation function in this example.

The processing of this example is performed by a program running in a computer or a processor or by a logic circuit.

Figure 14:
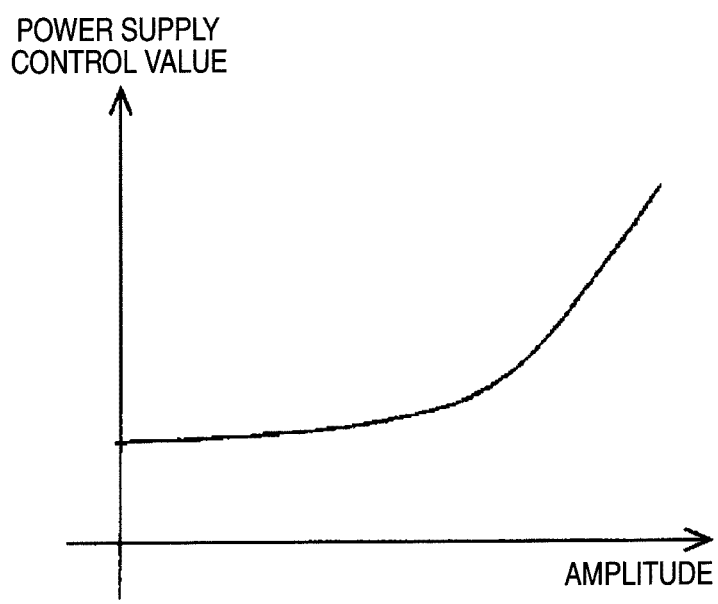
FIG. 14 is a diagram showing an example of mapping between amplitude and a power supply control value.

The horizontal axis of the graphs in FIG. 14, FIG. 6, and FIG. 3(b) indicates the amplitude, and the horizontal axis of the graphs in FIG. 7(a), FIG. 7(b), FIG. 7(c), and FIG. 3(a) indicates the power. This means that the same effect is achieved and, therefore, any unit, amplitude or power, may be used.

First, the symbols used in the processing flowchart in this example are described below.

G(t) represents the gain at time t.

Ref(t) represents the amplitude of the input signal at time t.

Fb(t) represents the amplitude of the feedback signal at time t.

Ei represents the range of amplitudes. Ei may be set to any value.

N represents the number of amplitude ranges. i=1, 2, ..., N.

$G_{|Ei}$ represents the gain of samples whose amplitude is included in Ei.

$Var(G_{|Ei})$ represents the variance of gains of the samples whose amplitude is included in Ei.

$\mu Ei$ represents the average of gains of samples whose amplitude is included in Ei.

Num(Ei) represents the number of samples, whose amplitude is included in Ei, within time T. T may be set to any value.

Th represents the threshold of the variance. Th may be set to any value.

V(Ei) represents the drain voltage (Vdd) of samples whose amplitude is included in Ei. In this example, an FET is used as an example of the amplifier, and the drain voltage (Vdd) applied to the FET is used.

$S_{vdd}$ represents the update step size of amplitude control values. $S_{vdd}$ may be set to any value.

Next, the processing flow of this example is described.

In this example, the processing between step S1 and step S9 (processing in step S2 to step S8) is executed repeatedly.

That is, the gain detection unit 24 calculates the gain G(t) for each sample within a predetermined time T (step S2). As one example, the gain G(t) is represented as G(t)=Ref(t)/Fb(t). The amplitude-gain mapping unit 25 obtains the mapping between the amplitude and the gain for each sample.

It is also possible to represent G(t) as G(t)=Fb(t)/Ref(t).

Next, the processing between step S3 and Step S8 (processing in step S4 to step S7) is executed sequentially for each of i=1, 2, ..., N.

First, the variance calculation unit 26 calculates the variance $Var(G_{|Ei})$ for the gains $G(t)=G_{|Ei}$ whose amplitude is included in each amplitude (transmission amplitude in this example) range Ei (step S4). As one example, $Var(G_{|Ei})$ is represented as $Var(G_{|Ei})=\Sigma(G_{|Ei}-\mu_{Ei})^2/Num(Ei)$ where $\Sigma$ represents the sum for the samples included in Num(Ei) (samples whose amplitude is included in Ei).

The amplitude-voltage update unit 27 determines the relation between the calculated variance $Var(G_{|Ei})$ and the threshold Th (step S5).

As a result, if the variance $Var(G_{|Ei})$ is equal to or smaller than the threshold Th, the amplitude-voltage update unit 27 updates the voltage V(Ei) to be applied to the power amplifier unit 4 so that the voltage V(Ei) is decreased by the update step size $S_{vdd}$ (step S6).

On the other hand, if the variance $Var(G_{|Ei})$ is larger than the threshold Th, the amplitude-voltage update unit 27 updates the voltage to be applied to the power amplifier unit 4 so that the voltage V(Ei) is increased by the update step size $S_{vdd}$ (step S7).

As described above, the ET amplifier with the distortion compensation function in this example includes the following in the ET adaptation unit 14: the amplitude detection unit 21 that detects the amplitude of an input signal, the detection unit 22 that detects a feedback signal, the amplitude detection unit 23 that detects the amplitude of the detected signal, the amplification factor calculation unit (gain detection unit 24) that calculates the amplification factor from the amplitude of the input signal and the amplitude of the feedback signal, the amplitude-amplification factor mapping unit (amplitude-gain mapping unit 25) that maps the amplification factor to the amplitude of the input signal, the variance calculation unit 26 that calculates the variance of the amplification factors, classified according to amplitude (amplitude range in this example), for each of the mapped and classified amplitudes, and the amplitude-voltage update unit 27 that sets the power supply voltage of the power amplifier unit 4 higher than the current voltage for an amplitude whose variance is larger than the variance threshold and, on the other hand, sets the power supply voltage of the power amplifier unit 4 lower than the current voltage for an amplitude whose variance is smaller than the variance threshold.

Therefore, the ET amplifier with the distortion compensation function in this example implements high quality and high efficiency of the power amplifier (power amplifier unit 4).

In the ET amplifier (one example of amplifying device) with the distortion compensation function in this example, the amplification means is configured by the function of the power amplifier unit 4 and the amplification control means is configured by the function of the power supply control unit 5 and the PA power supply unit 7. In this example, in the ET adaptation unit 14, the input amplitude detection means is configured by the function of the amplitude detection unit 21, the feedback detection means is configured by the function of the detection unit 22, the feedback amplitude detection means is configured by the function of the amplitude detection unit 23, the amplification factor (gain) detection means is configured by the function of the gain detection unit 24, the amplitude-amplification factor mapping means is configured by the function of the amplitude-gain mapping unit 25, the variance detection means is configured by the function of the variance calculation unit 26, and the amplification control update means is configured by the function of the amplitude-voltage update unit 27. In addition, the pre-distortion means is configured by the function of the DPD unit 11 or DPD control unit 13.

Third Embodiment

A third embodiment of the present invention is described below.

First, the outline is described.

In the first embodiment and the second embodiment, the configuration, in which the AM/AM characteristics are used, is described with reference to FIG. 1 to FIG. 4. The similar configuration may be applied also to the AM/PM characteristics because the variance is increased when there is a memory effect. Roughly, "amplification factor (gain)" that appears in the description, in which the AM/AM characteristics are used, is replaced by "phase difference" in the description in which AM/PM characteristics are used; for example, "variance of gains" is replaced by "variance of phase differences". It is mapped to the amplitude of the input signal when a phase difference is used.

Next, the third embodiment is described below more specifically.

Figure 5:
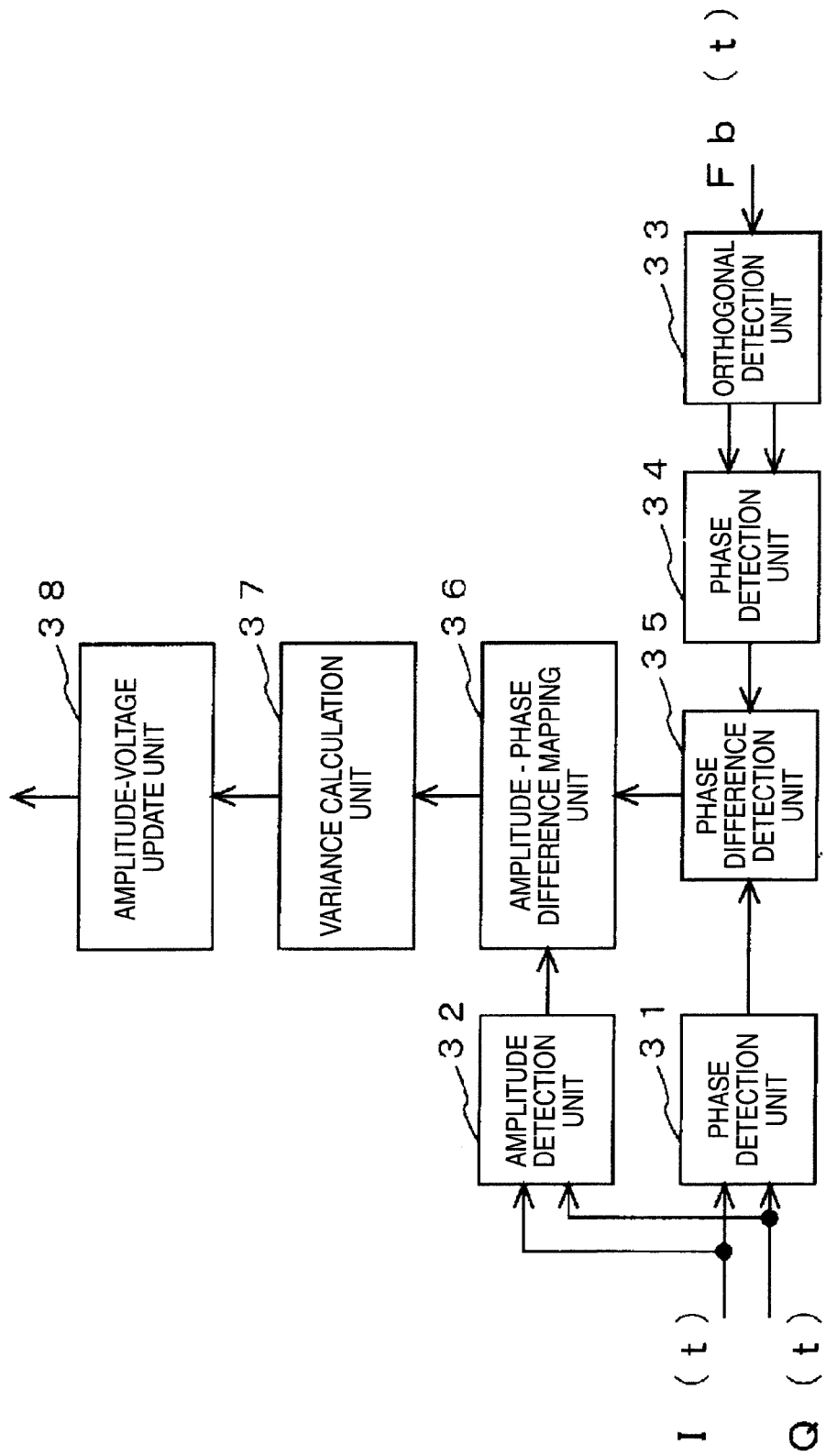
FIG. 5 is a diagram showing an example of the configuration of the ET adaptation unit.

FIG. 5 shows an example of the configuration of the ET adaptation unit 14, shown in FIG. 1, as one preferable embodiment.

The ET adaptation unit 14 in this example includes a phase detection unit 31, an amplitude detection unit 32, an orthogonal detection unit 33, a phase detection unit 34, a phase difference detection unit 35, an amplitude-phase difference mapping unit 36, a variance calculation unit 37, and an amplitude-voltage update unit 38.

An example of the operation performed by the ET adaptation unit 14 in this example is described below.

The input signals, I(t) and Q(t), of the phase detection unit 31 and the amplitude detection unit 32 are each a digital signal composed of the I phase and the Q phase.

The phase detection unit 31 detects the phase (instantaneous phase) of the input signal I(t) and Q(t) and outputs the detected phase to the phase difference detection unit 35.

As with the amplitude detection unit 115 shown in FIG. 12, the amplitude detection unit 32 uses (Expression 1) to calculate the instantaneous amplitude Env(t) based on the input signals I(t) and Q(t). Env(t) is the function of time t. In this example, the amplitude detection unit 32 outputs the calculated instantaneous amplitude Env(t) to the amplitude-phase difference mapping unit 36.

The input signal of the orthogonal detection unit 33 is a digitally converted feedback signal Fb(t) that is output signal from the power amplifier unit 4.

The orthogonal detection unit 33 performs orthogonal detection for the received feedback signal and outputs the result (I component and Q component) to the phase detection unit 34.

The phase detection unit 34 detects the phase (instantaneous phase) for the received signal (feedback signal), which is the result of orthogonal detection, and outputs the detected phase to the phase difference detection unit 35.

The phase difference detection unit 35 synchronizes the input signal with the feedback signal and, based on the instantaneous phase of the input signal and the instantaneous phase of the feedback signal stored in the memory, calculates the phase difference between the input signal and the feedback signal for a plurality of samples within an arbitrary limited duration and then outputs the calculated result to the amplitude-phase difference mapping unit 36.

The amplitude-phase difference mapping unit 36 maps the amplitude of the input signal, detected by the amplitude detection unit 32, to the phase difference, detected by the phase difference detection unit 35, and stores the mapping in the memory.

Using the data stored by the amplitude-phase difference mapping unit 36, the variance calculation unit 37 calculates the variance of the phase differences, included in the same amplitude range, for each amplitude range and outputs the calculated variance to the amplitude-voltage update unit 38. The range of amplitude may be any value.

The amplitude-voltage update unit 38 compares each phase difference variance and the threshold of the phase difference variance (variance threshold) and, according to the comparison result, updates the mapping between amplitudes and power supply control values stored in the power supply control unit 5. More specifically, the amplitude-voltage update unit 38 updates the power supply control value in such a way that the power supply voltage is increased for a range of amplitudes where the phase difference variance is larger than the variance threshold and that the power supply voltage is decreased for a range of amplitudes where the phase difference variance is smaller than the variance threshold.

As described above, the ET amplifier with the distortion compensation function in this example calculates the phase difference between the input signal and the feedback signal and calculates the variance of the phase differences for each amplitude of the input signal. For an amplitude whose variance is larger than the variance threshold determined according to the required quality, the power supply voltage of the power amplifier unit 4 is set higher than the current voltage. For an amplitude whose variance is smaller than the variance threshold, the power supply voltage of the power amplifier unit 4 is set lower than the current voltage.

More specifically, the ET amplifier with the distortion compensation function in this example includes the following in the ET adaptation unit 14: the phase detection unit 31 that detects the phase of an input signal, the amplitude detection unit 32 that detects the amplitude of an input signal, the orthogonal detection unit 33 that performs orthogonal detection for a feedback signal, the phase detection unit 34 that detects the phase of an orthogonally detected signal, the phase difference calculation unit (phase difference detection unit 35) that calculates the phase difference between the phase of the input signal and the phase of the feedback signal, the amplitude-phase difference mapping unit (amplitude-phase difference mapping unit 36) that maps the phase difference to the amplitude of the input signal, the variance calculation unit 37 that calculates the variance of the phase differences, classified according to amplitude (amplitude range in this example), for each of the mapped and classified amplitudes, and the amplitude-voltage update unit 38 that sets the power supply voltage of the power amplifier unit 4 higher than the current voltage for an amplitude whose variance is larger than the variance threshold and, on the other hand, sets the power supply voltage of the power amplifier unit 4 lower than the current voltage for an amplitude whose variance is smaller than the variance threshold.

Therefore, the ET amplifier with the distortion compensation function in this example implements high quality and high efficiency of the power amplifier (power amplifier unit 4).

In the ET amplifier (one example of amplifying device) with the distortion compensation function in this example, the amplification means is configured by the function of the power amplifier unit 4 and the amplification control means is configured by the function of the power supply control unit 5 and the PA power supply unit 7. In this example, in the ET adaptation unit 14, the input amplitude detection means is configured by the function of the amplitude detection unit 32, the input phase detection means is configured by the function of the phase detection unit 31, the feedback orthogonal detection means is configured by the function of the orthogonal detection unit 33, the feedback phase detection means is configured by the function of the phase detection unit 34, the phase difference detection means is configured by the function of the phase difference detection unit 35, the amplitude-phase difference mapping means is configured by the function of the amplitude-phase difference mapping unit 36, the variance detection means is configured by the function of the variance calculation unit 37, and the amplification control update means is configured by the function of the amplitude-voltage update unit 38. In addition, the pre-distortion means is configured by the function of the DPD unit 11 or DPD control unit 13.

Fourth Embodiment

A fourth embodiment of the present invention is described below.

In the first embodiment to the third embodiment, the ET amplifier with the distortion compensation function, including the DPD unit 11 and the DPD control unit 13 as shown in FIG. 1, is described as an example with reference to FIG. 1 to FIG. 5. As an example of another configuration, the ET adaptation unit 14 may be applied also to the ET amplifier without such a distortion compensation function.

One example of the configuration is the configuration of the ET amplifier shown in FIG. 1 in which the DPD unit 11 and the DPD control unit 13 are not provided. In this configuration, the input signals I(t) and Q(t) are input to the power supply control unit 5, two D/A converters 1 and 2, and ET adaptation unit 14 and the output signal from the A/D converter 12 is input to the ET adaptation unit 14.

The configuration of the ET adaptation unit 14 may be the configuration such as that shown in FIG. 2 and FIG. 5.

Any of various values may be set as the variance threshold according to the usage status.

As described above, the ET amplifier in this example causes the ET adaptation unit 14 to control the power supply control unit 5 so that the power supply control unit 5 can better control the power supply voltage of the power amplifier unit 4.

Summary of Embodiments

The configuration of the system or the devices in the present invention may not always be the configuration described above, but any of the various configurations may be used. For example, the present invention may also be provided as a method or a system for performing the processing of the present invention or as a program, or a recording medium recording therein the program, for implementing the method or the system. In addition, the present invention may be provided as various systems or devices.

The applicable field of the present invention is not limited to those described above, but the present invention may be applied to various fields.

Various types of processing performed by the system or the devices of the present invention may be configured in such a way that the processing is controlled by the processor that executes the control program, stored in the ROM (Read Only Memory), in the hardware resources including the processor and the memory or may be configured as a hardware circuit in which each of the function means for executing the processing is independent.

The present invention may also be considered as a computer readable recording medium, such as a floppy (registered trademark) disk or CD (Compact Disc)-ROM in which the control program described above is stored, or as the program (program itself). In this case, the control program is input from the recording medium into a computer for execution by the processor to perform the processing of the present invention.

INDUSTRIAL APPLICABILITY

The present invention is suitable for an amplifying that can be applied to a low distortion, high efficiency wideband system.

REFERENCE SIGNS LIST

1, 2, 6, 111, 112, 116, 201, 202, 206 . . . D/A converter, 3, 113, 203 . . . Orthogonal modulation unit, 4, 101, 114, 204 . . . Power amplifier unit (PA), 5, 205 . . . Power supply control unit, 7, 103, 117, 207 . . . PA power supply unit, 11, 211 . . . DPD unit, 12, 212. A/D converter, 13, 213 . . . DPD control unit, 14 . . . ET adaptation unit, 21, 23, 32, 102, 115 . . . Amplitude detection unit, 22 . . . Detection unit, 24 . . . Gain detection unit, 25 . . . Amplitude-gain mapping unit, 26, 37 . . . Variance calculation unit, 27, 38 . . . Amplitude-voltage update unit, 31, 34 . . . Phase detection unit, 33 . . . Orthogonal detection unit, 35 . . . Phase difference detection unit, 36 . . . amplitude-phase difference mapping unit

The invention claimed is:

1. An amplifying device that amplifies an input signal, comprising:
   amplification means that amplifies the input signal;
   amplification control means that controls a power supply voltage, which is supplied to the amplification means, based on the input signal;
   first detection means that detects a amplification factor or a phase difference between the input signal and a feedback signal generated by feeding back a signal amplified by the amplification means;
   second detection means that detects a variance of amplification factors or phase differences of each value or range of amplitude of the input signal for the amplification factors or phase differences detected by the first detection means; and
   amplification control update means that updates the power supply voltage, which is controlled by the amplification control means and is supplied to the amplification means, to a higher voltage for a value or range of amplitude where the variance detected by the second detection means is larger than a predetermined threshold, and updates the power supply voltage, which is controlled by the amplification control means and is supplied to the amplification means, to a lower voltage for a value or range of amplitude where the variance detected by the second detection means is smaller than the predetermined threshold.

2. The amplifying device according to claim 1,
   wherein the first detection means includes:
   input amplitude detection means that detects an amplitude of the input signal;
   feedback detection means that detects a feedback signal generated by feeding back the signal amplified by the amplification means;
   feedback amplitude detection means that detects an amplitude of the signal detected by the feedback detection means; and
   amplification factor detection means that detects a amplification factor based on the amplitude, detected by the input amplitude detection means, and the amplitude detected by the feedback amplitude detection means; and
   wherein the second detection means includes:
   amplitude-amplification factor mapping means that maps the amplification factor to the value or range of amplitude, the amplification factor detected by the amplification factor detection means, the value or range of amplitude detected by the input amplitude detection means;
   variance detection means that detects a variance of amplification factors of each value or range of amplitude of the input signal based on the mapping created by the amplitude-amplification factor mapping means; and the amplification control update means that updates the power supply voltage, which is controlled by the amplification control means and is supplied to the amplification means, to a higher voltage for a value or range of amplitude where the variance detected by the variance detection means is larger than a predetermined threshold, and updates the power supply voltage, which is controlled by the amplification control means and is supplied to the amplification means, to a lower voltage for a value or range of amplitude where the variance detected by the variance detection means is smaller than the predetermined threshold.

3. The amplifying device according to claim 1, wherein the first detection means includes:
   input amplitude detection means that detects an amplitude of the input signal;
   input phase detection means that detects a phase of the input signal;
   feedback orthogonal detection means that orthogonally detects a feedback signal generated by feeding back the signal amplified by the amplification means;
   feedback phase detection means that detects a phase of the signal detected by the feedback orthogonal detection means; and
   phase difference detection means that detects a phase difference based on the phase, detected by the input phase detection means, and the phase detected by the feedback phase detection means; and
wherein the second detection means includes:
   amplitude-phase difference mapping means that maps the phase difference to a value or range of amplitude, the phase difference detected by the phase difference detection means, the value or the range of amplitude detected by the input amplitude detection means;
   variance detection means that detects a variance of phase differences of each value or range of amplitude of the input signal based on the mapping created by the amplitude-phase difference mapping means; and
   the amplification control update means that updates the power supply voltage, which is controlled by the amplification control means and is supplied to the amplification means, to a higher voltage for a value or range of amplitude where the variance detected by the variance detection means is larger than a predetermined threshold, and updates the power supply voltage, which is controlled by the amplification control means and is supplied to the amplification means, to a lower voltage for a value or range of amplitude where the variance detected by the variance detection means is smaller than the predetermined threshold.

4. The amplifying device according to claim 1, further comprising:
   pre-distortion means that performs distortion compensation for the signal, amplified by the amplification means, using a pre-distortion method.

5. The amplifying device according to claim 2, further comprising:
   pre-distortion means that performs distortion compensation for the signal, amplified by the amplification means, using a pre-distortion method.

6. The amplifying device according to claim 3, further comprising:
   pre-distortion means that performs distortion compensation for the signal, amplified by the amplification means, using a pre-distortion method.

* * * * *